United States Patent [19]

Dawson et al.

[11] Patent Number: 4,995,001
[45] Date of Patent: Feb. 19, 1991

[54] MEMORY CELL AND READ CIRCUIT

[75] Inventors: James W. Dawson, Poughkeepsie; Panagiotis A. Phillips, Newburgh, both of N.Y.

[73] Assignee: International Business Machines Corporation, Armonk, N.Y.

[21] Appl. No.: 265,075

[22] Filed: Oct. 31, 1988

[51] Int. Cl.⁵ .................. G11C 11/00; G11C 11/34; G11C 7/00; G11C 8/00
[52] U.S. Cl. .................. 365/154; 365/177; 365/190; 365/230.05
[58] Field of Search ............ 365/154, 190, 230.05, 365/203, 156, 177, 189.01

[56] References Cited

U.S. PATENT DOCUMENTS

| | | | |
|---|---|---|---|
| 3,440,444 | 4/1969 | Rapp | 365/154 |
| 3,668,656 | 6/1972 | Hoggar | 365/154 |
| 3,968,480 | 7/1976 | Stein | 365/202 |
| 4,112,506 | 9/1978 | Zibu | 365/181 |
| 4,149,268 | 4/1979 | Waters | 365/95 |
| 4,262,340 | 4/1981 | Sasaki et al. | 365/154 |
| 4,375,677 | 3/1983 | Schuermeyer | 365/154 |
| 4,380,055 | 4/1983 | Larson | 365/154 |
| 4,387,444 | 6/1983 | Edwards | 365/156 |
| 4,395,765 | 7/1983 | Moffitt et al. | 365/174 |
| 4,447,891 | 5/1984 | Kadota | 365/154 |
| 4,491,937 | 1/1985 | Chan | 365/154 |
| 4,499,558 | 2/1985 | Mazin et al. | 365/182 |
| 4,527,255 | 7/1985 | Keshtbod | 365/154 |
| 4,541,076 | 9/1985 | Bowers et al. | 365/190 |
| 4,567,577 | 1/1986 | Oliver | 365/156 |
| 4,571,703 | 2/1986 | Noda | 365/154 |
| 4,580,245 | 4/1986 | Ziegler et al. | 365/154 |
| 4,592,023 | 5/1986 | Beranger et al. | 365/154 |
| 4,638,461 | 1/1987 | Yonezu et al. | 365/189 |
| 4,639,898 | 1/1987 | Sauer | 365/202 |
| 4,644,500 | 2/1987 | Yonezu et al. | 365/189 |
| 4,653,025 | 3/1987 | Minato et al. | 365/154 |
| 4,654,823 | 3/1987 | Charransol et al. | 365/174 |
| 4,654,824 | 3/1987 | Thomas et al. | 365/175 |
| 4,660,177 | 4/1987 | O'Connor | 365/189 |
| 4,701,882 | 10/1987 | Birritella et al. | 365/154 |
| 4,701,883 | 10/1987 | Wrathall et al. | 365/154 |
| 4,703,458 | 10/1987 | Stipanuk | 365/189 |
| 4,719,596 | 1/1988 | Bernstein et al. | 365/189 |
| 4,744,056 | 5/1988 | Yu et al. | 365/154 |
| 4,747,078 | 5/1988 | Miyamoto | 365/51 |
| 4,779,230 | 10/1988 | McLaughlin et al. | 356/156 |
| 4,858,183 | 8/1989 | Scharrer et al. | 356/156 |

FOREIGN PATENT DOCUMENTS

| | | |
|---|---|---|
| 233968 | 9/1987 | European Pat. Off. . |
| 114834 | 12/1979 | Japan . |
| 1285534 | 1/1987 | U.S.S.R. . |

OTHER PUBLICATIONS

Fields, "Low Voltage Memory Cell", IBM *TDB*, vol. 22, No. 10, Mar. 1980, pp. 4555-4556.
Denis et al, "Static RAM Cell with Selected Barrier Height Schottky Diodes," IBM *TDB*, vol. 24, No. 1A, Jun. 1981, pp. 85-87.
Shen, "Multi-Port RAM Cell Structure" IBM TDB, vol. 26, No. 7B, Dec. 1983, pp. 3588-3589.
IBM Technical Disclosure Bulletin, vol. 14, No. 11, p. 3211, Apr. 1972, W. D. Pricer et al., "Memory Array Selection Technique."
IBM Technical Disclosure Bulletin, vol. 14, No. 12, pp. 3640-3641, May 1972, U. Baitinger et al., "Monolithic Storage Cell with FETs."

(List continued on next page.)

*Primary Examiner*—Stuart N. Hecker
*Assistant Examiner*—Michael A. Whitfield
*Attorney, Agent, or Firm*—Otho B. Boss; Yen S. Yee

[57] ABSTRACT

The present invention relates to a memory cell, and more particularly to a single-bit, dual-port cell, and a single-sided read circuit for use with one or more such cells. The cell may, in one embodiment, be used in a static random access memory (RAM) array, and may be implemented in BICMOS technology on an integrated circuit. The cell has a flip-flop storage unit comprising a CMOS circuit of cross-coupled inverters coupled to dual CMOS pass gates to provide isolation and data transfer. The storage unit is also coupled to a bipolar read line driver in a particular configuration to accomplish rapid bit line pull-up or pulldown for high speed read operation. Several alternative embodiments are disclosed.

60 Claims, 12 Drawing Sheets

IBM Technical Disclosure Bulletin, vol. 17, No. 11, pp. 3338–3339, Apr. 1975, H. Linton et al., "Low-Power FET Storage Cell."

IBM Technical Disclosure Bulletin, vol. 31, No. 1, p. 291, Jun. 1988, W. D. Loehlein et al., "Combined Single/Dual–Port Array Approach with 6–Device Cell."

IEEE Journal of Solid–State Circuits article, vol. SC–20, No. 5, pp. 1012–1017, Oct. 1985, H. Takahashi et al., "A 240K Transistor CMOS Array with Flexible Allocation of Memory and Channels."

IEEE Journal of Solid–State Circuits article, vol. SC–22, No. 4, pp. 616–619, Aug. 1987, H. De Los Santos et al., "On the Analysis and Design of CMOS–Bipolar SRAM'S."

IEEE Journal of Solid–State Circuits article, vol. SC–22, No. 5, pp. 847–849, Oct. 1987, S. Miyaoka et al., "A 7–ns/350–mW 64–kbit ECL–Compatible RAM."

IEEE Journal of Solid–State Circuits article, vol. SC–22, No. 5, pp. 657–662, Oct. 1987, G. Kitsukawa et al., "An Experimental 1–Mbit BiCMOS DRAM."

IEEE Journal of Solid–State Circuits article, vol. SC–22, No. 5, pp. 712–720, Oct. 1987, K. O'Connor, "The Twin–Port Memory Cell."

IEEE Journal of Solid–State Circuits article, vol. 23, No. 1, pp. 68–73, Feb. 1988, T. Douseki et al., "BICMOS Circuit Technology for a High–Speed SRAM."

IEEE Journal of Solid–State Circuits article, vol. 23, No. 5, pp. 1030–1039, Oct. 1988, T-S Yang et al., "A4–ns 4Kx1-bit Two–Port BICMOS SRAM."

IEEE Journal of Solid–State Circuit Conference Proceedings, pp. 132–133, Feb. 26, 1987, S. Miyaoka et al., "A 7ns/350–mW 64 EC1 Compatible RAM."

Intel Memory Components Handbook article, pp. 3–38 to 3–45, Mar. 1980, J. Altnether, "High Speed Memory System Design Using 2147H."

MEMORY CELL AND READ CIRCUIT

Cross-Reference to Related Application

Reference is made to U.S. Pat. application, Ser. No. 014,886, now U.S. Pat. No. 4,845,676, filed Feb. 13, 1987, by W-L. Lohlein, entitled "Non-Clocked Static Memory Cell," and assigned to the assignee of the present invention. The invention relates to a static all-CMOS memory cell of cross-coupled transistors having an additional bit line driver/isolation stage configured as a CMOS inverter between one cell node and a read-select transistor.

DESCRIPTION

Background of the Invention

The present invention relates to a memory cell, and more particularly to a single-bit, dual-port cell, and a single-sided read circuit for use with one or more such cells. The cell may, in one embodiment, be used in a static random access memory (RAM) array, and may be implemented in BICMOS technology (i.e., having both bipolar and CMOS or NMOS field-effect transistors (FETs)) on an integrated circuit. Several alternative embodiments are also disclosed.

Static RAM CMOS memory cells are well known. A typical prior art cell is shown in block diagram form in FIG. 1. Such a device typically is comprised of a bit storage unit 10 coupled to pass or transfer devices 12 and 14 for the writing and reading of data, respectively. Write pass device 12, coupled to an input 11 of storage unit 10, permits data on a write bit line (WBL) 16 to be written into the storage unit upon receipt of a signal, such as a write enable or write word signal, sent over write word line (WWL) 20. The data is typically a binary signal (logical "1" or "0"), represented by a low signal level or high signal level on the write bit line 16. A read operation is accomplished when a read enable or read word signal is sent over a read word line (RWL) 22, which activates read pass device 14 to allow data to be read out of storage unit 10 through output 13 and pass device 14 onto read bit line (RBL) 18. The cell of FIG. 1 thus operates as a dual-port memory cell, the first port being the write bit line/write word line pair and the second port being the read bit line/read word line pair.

A specific circuit implementation of the prior art cell of FIG. 1 is shown in FIG. 2. Such a cell, commonly known as a "6-device cell," is comprised of six FETs, specifically transistors 24, 26, 28, 30, 32 and 34 in the diagram. This type of circuit is disclosed, for example, in U.S. Pat. Nos. 4,580,245; 4,638,461; 4,644,500; and IBM Technical Disclosure Bulletin, Vol. 31, No. 1, June 1988, at p. 291; and a similar cell is disclosed in IBM Technical Disclosure Bulletin, Vol. 17, No. 11, April 1975, at p. 3338.

The primary feature of such cells is a bit storage unit comprised of a flip-flop or latch. The flip-flop is formed from four FETs, specifically 24, 26, 28, 30, in a dual, cross-coupled inverter configuration. Transistor 24 is typically of the opposite conductivity type from transistor 26, and transistor 28 is typically of the opposite conductivity type from transistor 30. For example, transistors 24 and 28 usually are P-channel FETs (PFETs) and transistors 26 and 30 usually are N-channel FETs (NFETs). The source-drain current paths of transistors 24 and 26 are coupled in series with each other and between a voltage source $V_c$ 31 and a ground terminal 33. Similarly, the source-drain current paths of transistors 28 and 30 are coupled in series with each other and between voltage source 31 and ground terminal 33. The gates of transistors 24 and 26 are coupled together and the gates of transistors 28 and 30 are similarly coupled together. A connection from the gates of transistors 28 and 30 to the intersection of the source-drain current paths of transistors 24 and 26 forms a first internal node 25 of the cell, and a connection from the gates of transistors 24 and 26 to the intersection of the source-drain current paths of transistors 28 and 30 forms a second internal node 29.

The input (for writing) of the storage unit 10 is the first internal node 25, coupled through the source-drain current path of write pass transistor 32 to write bit line 16. Transistor 32 is controlled by an enable signal applied to its gate over write word line 20 to permit data on line 16 to flow into the flip-flop, setting it into one of two bistable states. An analogous arrangement is provided on the output or read side of the device. The second internal node 29 is coupled through the source-drain current path of read pass transistor 34 to read bit line 18. Reading is accomplished by applying an enable signal to the gate of transistor 34 over read word line 22.

Although the prior art cell of FIG. 2 accomplishes a basic data read and data write function in a two-port manner, problems sometimes arise in the operation of this device. One problem is that both the write operation and the read operation require a voltage level change on the appropriate bit line. For example, the reading of a "1" may require the voltage on read bit line 18 to be "pulled-up" or "pulled-down." If the pass transistor 34 alone is relied upon for this operation, a delay may result because transistor 34, being an FET, typically cannot handle high currents or switch rapidly. The delay is increased if several cells are attached to the same bit lines, thus increasing the capacitive load that must be overcome. Also, the voltage swing on read bit line 18 will be limited.

Another problem with the cell of FIG. 2 is that the data stored in the flip-flop is sometimes disturbed by the read operation itself. The activation of pass transistor 34 by the enable signal on read word line 22 sometimes permits the data current or other spurious currents on read bit line 18 to flow through transistor 34 into or out of the flip-flop device, which currents may be high enough either to change the state of the cell, thus destroying the data, or to slow down the operation of the cell. The size of transistor 34 is critical with respect to the flip-flop device sizes. If the correct size limits on transistor 34 are not observed, then the cell is subject to disturb problems.

Summary of the Invention

The present invention is intended to remedy the above-mentioned disadvantages and provide a memory cell capable of extremely rapid reading of information and having a very low susceptibility to read disturb problems. Several alternative embodiments are disclosed, including a cell having a single-sided read circuit with isolation and fast bit-line drive; a cell having two read ports; a cell having a differential read; a read circuit for an entire array of cells; and a continuous-read cell. The embodiments may be implemented in BICMOS technology.

In one embodiment, the present invention comprises: a storage unit for storing a data signal;

a pass device and a pass/isolation device, each having a signal path and a control terminal, the signal paths therethrough being coupled together in series between a control node and a read line, the control terminal of the pass device being coupled to an enable line and the control terminal of the pass/isolation device being coupled to the storage unit; and a driver having a signal path coupled between the read line and a constant-signal node, and having a control terminal coupled to the control node, and arranged to cause a read signal proportional to the data signal to appear on the read line in response to an enable signal on the enable line.

In another embodiment, the present invention comprises a read circuit for a memory array, comprising:

at least one storage unit for storing at least one data signal;

at least one pass device and at least one pass/isolation device associated with each storage unit, the pass device and the pass/isolation device each having a signal path and a control terminal;

each storage unit being coupled to the control terminal of its associated pass/isolation device, the signal path of the pass/isolation device being coupled at one end to a common control line and coupled at the other end to one end of the signal path of the pass device, the other end of the pass device signal path being coupled to a common read line, the control terminal of the pass device being coupled to an enable line; and a common driver having a signal path coupled between the common read line and a common constant-signal node, and having a control terminal coupled to the common control line, and arranged to cause a read signal proportional to the data signal stored in any one storage unit to appear on the common read line in response to an enable signal on the enable line associated with that storage unit.

In yet another embodiment, the present invention comprises a memory cell comprising:

a storage unit for storing a data signal;

a pass device and a pass/isolation device, each having a signal path and a control terminal, the signal paths therethrough being coupled together in series between a control node and a first constant signal node, the control terminal of the pass device being coupled to an enable line and the control terminal of the pass/isolation device being coupled to the storage unit; and a driver having a signal path coupled between the read line and the first constant-signal node, and having a control terminal coupled to the control node, and arranged to cause a read signal proportional to the data signal to appear on the read line in response to an enable signal on the enable line.

Other variations and embodiments of the invention are also disclosed, and are discussed more fully in the detailed description below.

BRIEF DESCRIPTION OF THE DRAWINGS

To facilitate further description of the invention, the following drawings are provided in which.

DETAILED DESCRIPTION OF THE PREFERRED EMBODIMENTS

Figure 3:
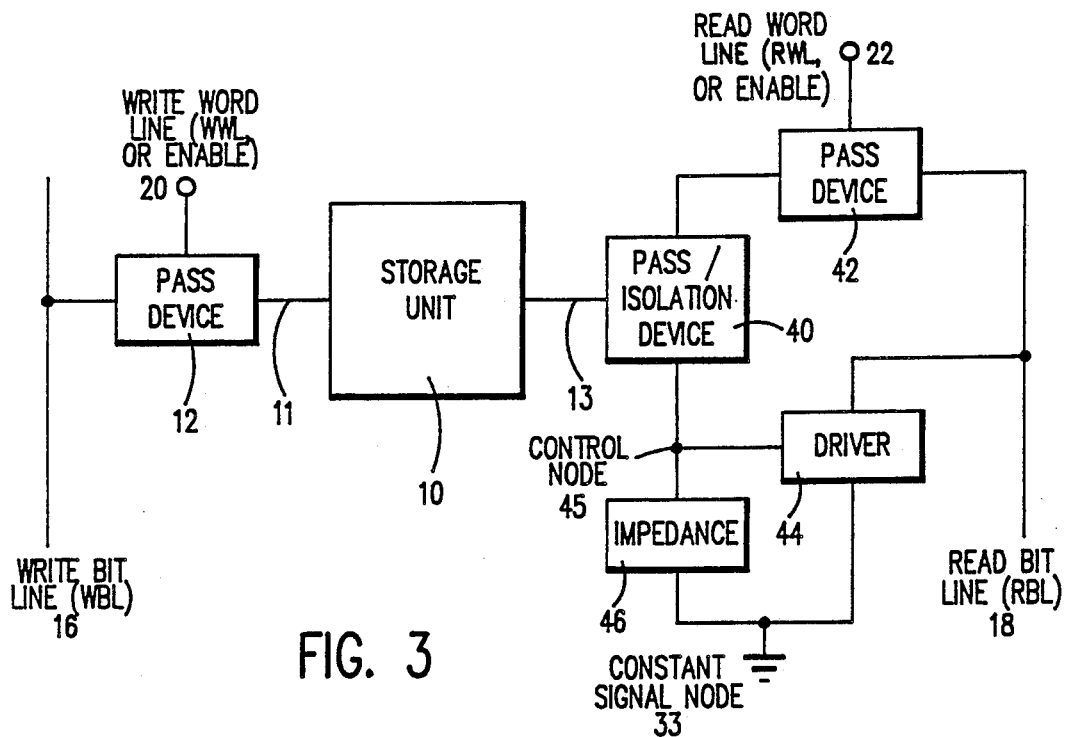
FIG. 3 is a block diagram of one embodiment of the present invention.

Referring now to FIG. 3, there is shown therein a functional block diagram of one embodiment of the present invention. The present invention is not, however, limited to this particular configuration or to the configuration shown in any other drawing.

In FIG. 3, a storage unit 10 is provided for the storage of data such as a single bit. Storage unit 10, which may comprise a flip-flop, has an input 11 for writing, which is coupled to one of a signal path of a pass device 12. The other end of this signal path is coupled to a write bit line 16, and the signal path is controlled by signals on a write word line (WWL) 20. Information (represented, for example, by a high or log level signal) present on write bit line 16 may be gated into storage unit 10 through pass device 12 in response to a write enable (word select) signal sent over write word line 20 to the control terminal of pass device 12.

The present invention may also be used in connection with a read-only memory (ROM), in which case elements 11, 12, 16 and 20 need not be present, or may be present but non-operational.

A feature of the present invention is the read circuit shown generally by elements 40, 42, 44 and 46 of FIG. 3. The read or output terminal 13 of storage unit 10 is coupled to a control terminal of a pass/isolation device 40. Pass/isolation device 40 also has a signal path that is coupled in series with a signal path of second pass device 42. Pass device 42 is, in turn, coupled through its signal path to a read bit line (RBL) 18, and is controlled by signals from read word line (RWL) 22 input to a control terminal of device 42. The signal path of pass-/isolation device 40 is further coupled to a control node 45 and then through an impedance 46 to a constant signal node 33, which could be ground or any other constant signal source or sink, such as a voltage terminal of a power supply. Element 44 is a read line drive having a signal path that is coupled between read bit line 18 and constant signal node 33, and a control terminal that is coupled to control node 45.

The primary function of pass device 42 is to allow a read operation to take place from storage unit 10 by way of a read enable (word select) signal applied over read word line 22 to the control terminal of pass device 42. Pass device 42 is not needed if a continuous read or latch function is desired. In such a case, device 2 may be replaced by a signal path connecting pass isolation device 40 directly to read bit line 18.

Pass/isolation device 40, as the name implies, performs two functions—operating as a pass device in conjunction with pass device 42 to enable the reading of data, and providing isolation between storage unit 10 and read bit line 18, so as to prevent read or stray signals from read bit line 18 from entering storage unit 10 and adversely affecting the data stored in such unit.

A primary purpose of read line driver 44 is to cause a rapid transition of the signal level on read bit line 18 to take place if, at the beginning of a read operation, the signal level in storage unit 10 is at a different level from the standby signal level on read bit line 18. For a high-speed memory operation, the signal level on read bit line 18 should move from a low level to a high level or vice versa as rapidly as possible without causing interference with the data in storage unit 10. This change of levels is sensed by a sense amplifier (not shown) to read the data.

A primary function of impedance 46 is to prevent the control terminal of read line driver 44 from "floating" between memory cycles, so that the driver is not turned on at the wrong time in the memory cycle. Impedance 46 is not, however, needed if the control terminal of driver 44 is not susceptible to "floating" problems.

Figure 4:
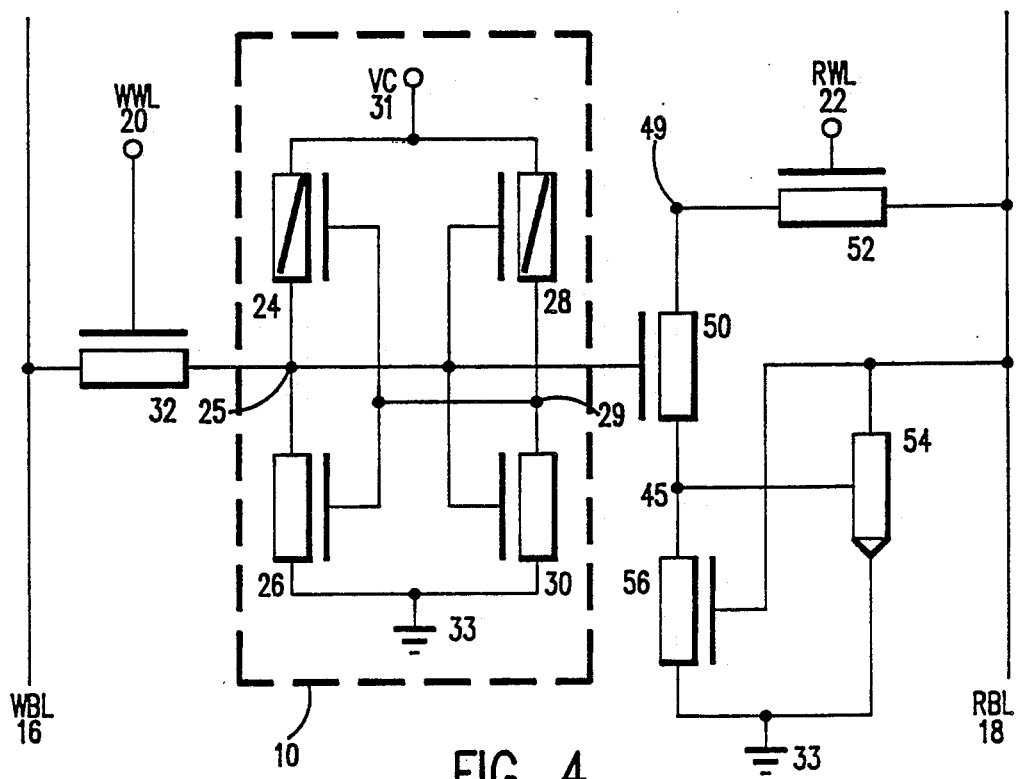
FIG. 4 is a schematic circuit diagram of one embodiment of FIG. 3.
Figure 5:
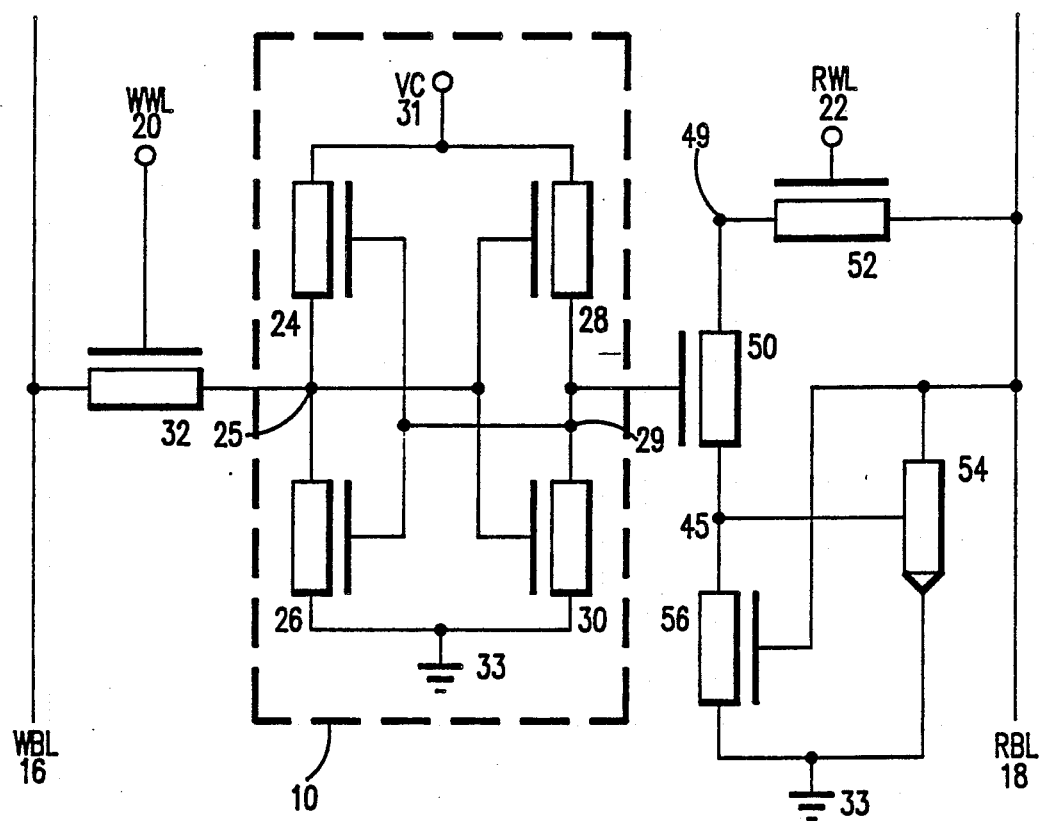
FIG. 5 is a schematic circuit diagram of an alternative embodiment of FIG. 3.

Preferred circuit implementations of the cell of FIG. 3 are shown in FIGS. 4 and 5. In FIG. 4, the storage unit 10, shown in dashed lines, is comprised of 4 transistors, preferably FETs, as in the prior art cell of FIG. 2. Transistors 24 and 28 are preferably PFETs, although they could be resistors instead. Transistors 26 and 30 are preferably NFETs. Internal power to these transistors is supplied by a voltage between voltage terminal $V_c$ 31 and ground. Internal node 25 forms the input for writing and also the output for reading. Alternatively, internal node 29 could form the output. The differential voltage on these two internal nodes equals $V_c$ minus ground, the maximum possible.

Pass device 12 in the preferred embodiment of FIG. 4 comprises an NFET 32, which has its source-drain current path coupled between internal node 25 and write bit line 16. The source terminal of transistor 32 is preferably coupled to internal node 25, and the drain terminal of transistor 32 is preferably coupled to write bit line 16. The gate terminal of transistor 32 comprises its control terminal, and it is coupled to write word line 20.

The read circuit of the present invention is preferably implemented by way of four transistors, specifically two NFETs 50 and 52, an NPN bipolar transistor 54 and an NFET 56, to form a single-sided read circuit. Transistor 50 comprises the pass/isolation device 40 of FIG. 3, and transistor 52 comprises the pass device 42 of FIG. 3. The source-drain current paths of transistors 50 and 52 are coupled together in series and between the read bit line 18 and the control node 45, as shown. In a preferred embodiment, the source terminal of transistor 50 is coupled to node 45, the drain terminal of this transistor is coupled to the source terminal of transistor 52 and the drain terminal of transistor 52 is coupled to read bit line 18. The gate terminal of transistor 50 is coupled to the internal node 25 of the storage unit 10, and the gate terminal of transistor 52 is coupled to the read word line 22. Transistor 52 could be removed (shorted out across its source-drain current path) if a continuous read or latch function is desired.

The read bit line driver 44 (FIG. 3) in the preferred embodiment of FIG. 4 comprises a bipolar transistor 54, preferably of the NPN type. The collector terminal of this transistor is preferably coupled to the read bit line 18, the emitter terminal is coupled to constant signal node 33 (which is ground in this embodiment), and the base terminal is coupled to control node 45.

The impedance 46 (FIG. 3) comprises an NFET in the preferred embodiment of FIG. 4, although a resistor could be used instead. If an NFET is used, the source-drain current path is coupled between control node 45 and ground (the source terminal preferably being grounded), and the gate terminal is coupled to the read bit line.

An alternative embodiment of the circuit of FIG. 4 is shown in FIG. 5. FIG. 5 is identical to FIG. 4, except that the gate of transistor 50 is coupled to internal node 29 of storage unit 10 instead of to internal node 25, as in FIG. 4.

The read operation of the memory cell of FIG. 3 will now be described, with particular reference to FIG. 5. Assume, first, that a logical "0" has previously been stored in storage unit 10. In order to read this 0 level out, read bit line 18 will normally be "precharged" to a high level. (Precharging circuitry could, for example be provided by a resistive load coupled between voltage terminal $V_c$ 31 and read bit line 18, with a switch coupled to the timing circuitry for the memory). When a "0" is stored in storage unit 10, internal node 29 is at a high level and internal node 25 is at a low level.

The reading of the "0" data is enabled by a signal sent over read word line 22 to the gate of transistor 52. When this device turns on, transistor 52 provides a conducting signal path between read bit line 18 and transistor 50. Since internal node 29 is high and is coupled to the gate of transistor 50, transistor 50 also conducts. With both devices 50 and 52 conducting, a completed current path is established between the read bit line 18 and control node 45, and then to the base of bipolar transistor 54. The base of transistor 54 was initially at a low level because transistor 56 had previously been on and conducting to the ground terminal 33 by way of the high signal from read bit line 18 to the gate of transistor 56.

As soon as bipolar transistor 54 turns on and conducts, the voltage at the collector quickly drops toward ground level, and consequently quickly pulls the voltage on read bit line 18 down to ground. A sense amplifier (not shown), coupled to read bit line 18, senses the change of voltage on read bit line 18 from high to low and interprets this as the reading of a "0" from the memory cell. Transistor 56 is small in comparison with the other transistors and cannot hold the base of transistor 54 low when the transistors 50 and 52 are conducting. The purpose of transistor 56 is to prevent the base of transistor 54 from "floating" to a level higher than ground when transistors 50 or 52 are off (i.e., when the cell is in a standby mode or a write mode). Should transistor 54 be provided with a non-floating base, or another mechanism to prevent false turn-ons, then transistor 56 would not be required.

Assume now that a logical "1" has been stored in the storage unit 10 of FIG. 5, and it is desired to read this data. Internal node 29 will show a low signal level and internal node 25 will show a high signal level in this event. With node 29 "low", transistor 50 will not turn on, even when transistor 52 is turned on by the enable signal at its gate from read word line 22. Thus, control node 45 will stay at a low voltage level and will also keep the base of transistor 54 low, preventing transistor 54 from conducting along its collector-emitter current path. Read bit line 18 was previously precharged high, as before. Since transistor 54 does not conduct upon a read signal, read bit line 18 will stay high, and a "1" is read by the sense amplifier (not shown). The read operations described above could either be clocked or non-clocked.

The operation of the circuit of FIG. 4 is the same as the operation of the circuit of FIG. 5, except that the data on the read bit line 18 is inverted relative to the data on the read bit line 18 of FIG. 5. FIG. 4 also has a faster write time than FIG. 5.

Figure 1:
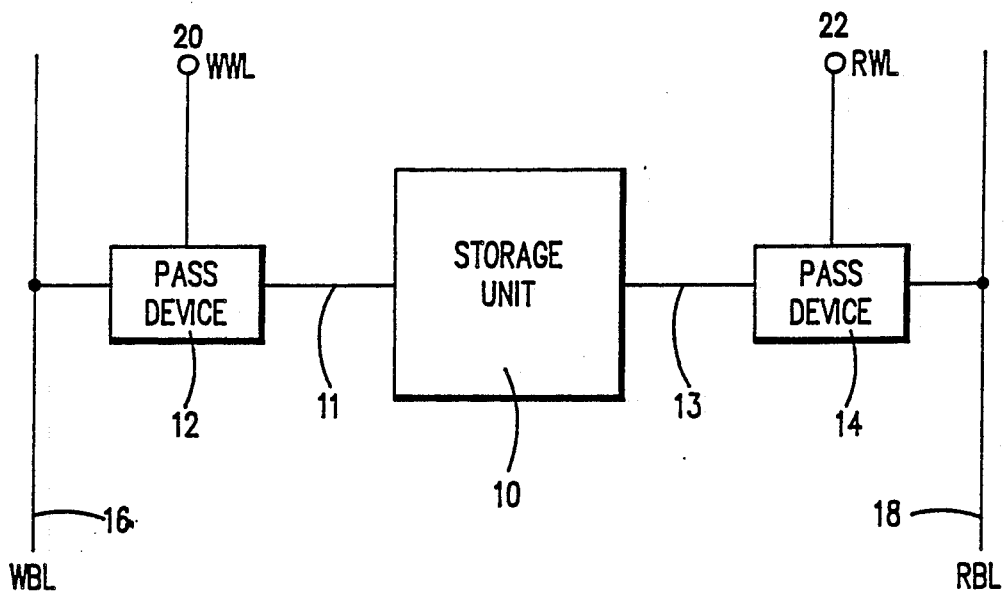
FIG. 1 is a block diagram of a typical prior art single-bit, dual-port static RAM cell.
Figure 2:
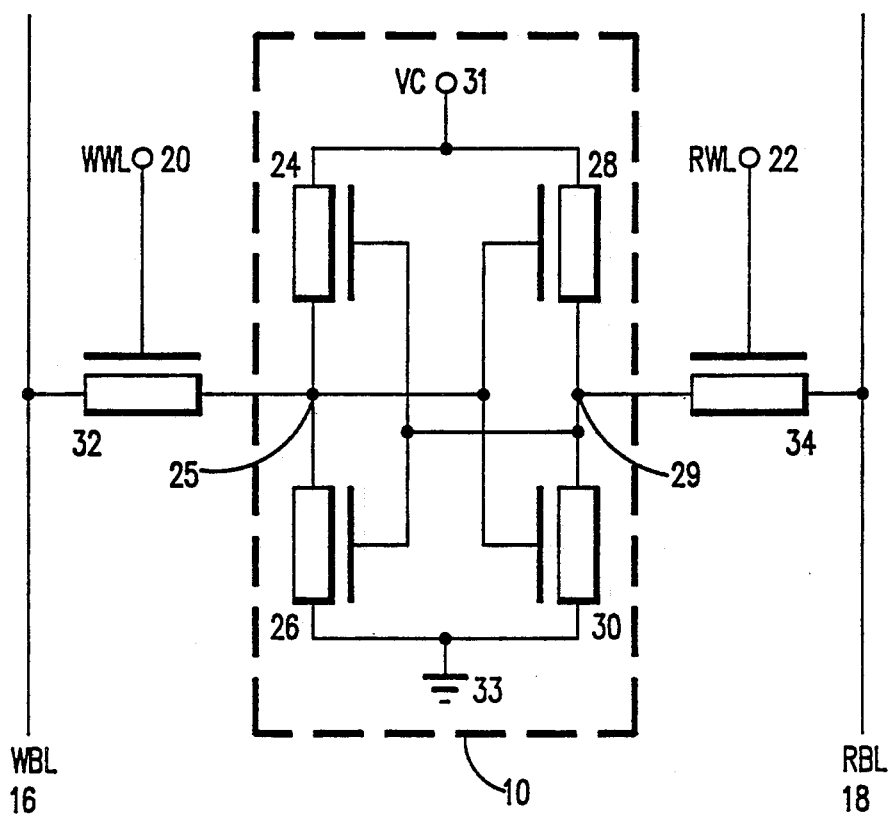
FIG. 2 is a schematic circuit diagram of a typical prior art implementation of the memory cell of FIG. 1.

An advantage offered by the circuits of FIGS. 4 and 5 over the prior art circuit of FIG. 2 is that the data stored in storage unit 10 is much less susceptible to being disturbed by the read operation going on in read bit line 18 and its associated circuitry, elements 50, 52, 54 and 56. Transistor 50 provides a type of isolation between read bit line 18 and storage unit 10, there being very little leakage current between the source-drain current path and the gate terminal of transistor 50. Thus, it is difficult for signals on read bit line 18 to change the data in storage unit 10 by going back through the gate of transistor 50.

An additional, significant feature of the present invention is the fast switching speed and high current handling ability of bipolar transistor 54. Since bipolar transistors generally switch on and off much faster than FETs of comparable size, the use of a bipolar type in this particular configuration in the read circuitry permits extremely rapid switching times for read bit line 18 (i.e., transition times from low level to high level and vice versa). Larger voltage and current levels than the levels in storage unit 10 can also be handled. Bipolar transistors are, however, generally larger and require more power than FETs, so it is often not desirable to construct the entire memory cell circuit with only bipolar transistors. The use of only one bipolar transistor for bit line switching, while continuing to use CMOS devices for storage unit 10, thus accomplishes the goal of rapid switching time, while permitting the cell to be kept to a very small size on an integrated circuit chip. The cell is also able to draw a lower total current than would be drawn by an all-bipolar cell.

Another feature of the invention is the use of an impedance, specifically transistor 56, to maintain the base of transistor 54 at a low level during standby operation. Without transistor 56 to tie the base of transistor 54 to ground, transistor 54 could be subject to "floating" or unpredictable voltage levels at its base from control node 45. Such a floating level might, in some cases, be such as to cause transistor 54 to conduct, thus sending a false bit of information onto read bit line 18 and possibly also back into storage unit 10. Transistor 56 could, instead, be a resistor or other type of impedance sufficient to maintain the base of transistor 54 at or close to ground when the cell is not being read.

Another noteworthy feature of the cell of FIG. 4 is the special arrangement of the internal nodes 25 and 29 of storage unit 10. In particular, the internal node 25 is used as the output node (i.e., coupled to the gate of transistor 50), whereas in FIG. 5 the internal node 29 is used as the output node. This configuration permits the cell of FIG. 4 to write substantially faster than the cell of FIG. 5. It also causes the data signal on read bit line 18 of FIG. 4 to be inverted relative to the data signal on the same line of FIG. 5.

Figure 6:
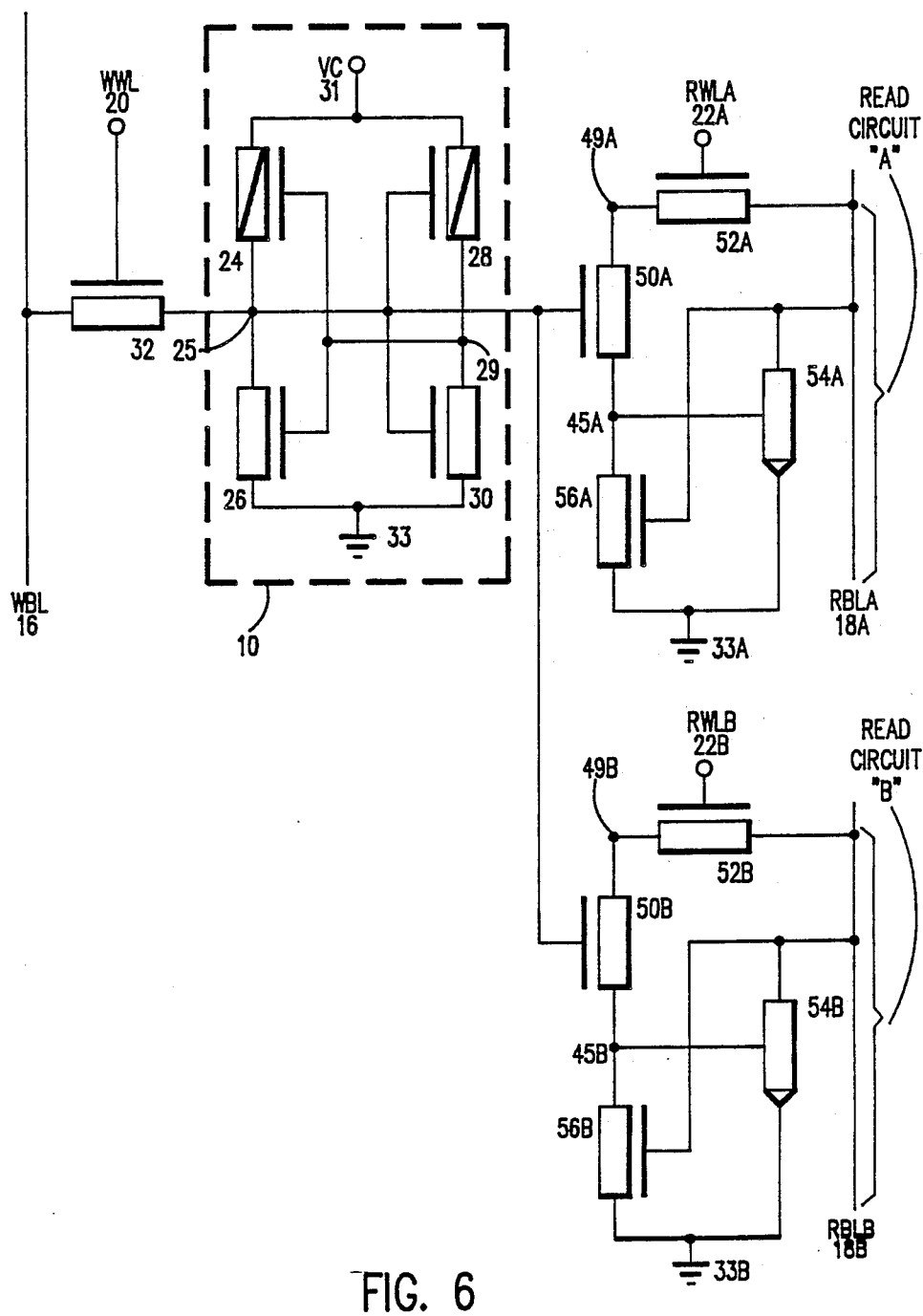
FIG. 6 is a schematic circuit diagram of an embodiment of the invention using two of the read circuits of FIG. 4 to form a cell with two read ports.

Although the cells of FIGS. 4 and 5 show implementations of the invention in the form of 2-port, single-sided read cells, other implementations are also possible. For example, FIG. 6 shows a 3-port cell having one write port and two read ports, each read port having a read circuit ("A" or "B") that is similar to the read circuit of FIG. 4. Two separate read word lines 22A, 22B and two separate read bit lines 18A, 18B are provided, one of each per port. Both ports are attached to internal node 25, or to 29 if desired. This permits access to the same data from two or more independent ports. A similar arrangement is possible for the writing of data—multiple ports could be attached to internal node 25 for writing.

Another possible implementation of the invention is in a differential read circuit. For example, if FIG. 6 is modified to connect read circuit "B" to internal node 29 instead of to internal node 25, and to connect read word line 22B to read word line 22A, the cell becomes a 2-port cell having a differential read capability, assuming the proper sense amplifier is connected to both read bit lines 18A and 18B.

Still another feature of the present invention is that the read circuit with the bipolar driver transistor may be used with more than one memory cell. Referring now to the block diagram of FIG. 7, there is illustrated a plurality of memory cells comprising, for example, a column or array of cells. Each cell consists of a storage unit 10 coupled via output 13 to a pass/isolation device 40 which, in turn, is coupled to a pass device 42, in a manner similar to that shown in FIG. 3.

Figure 7:
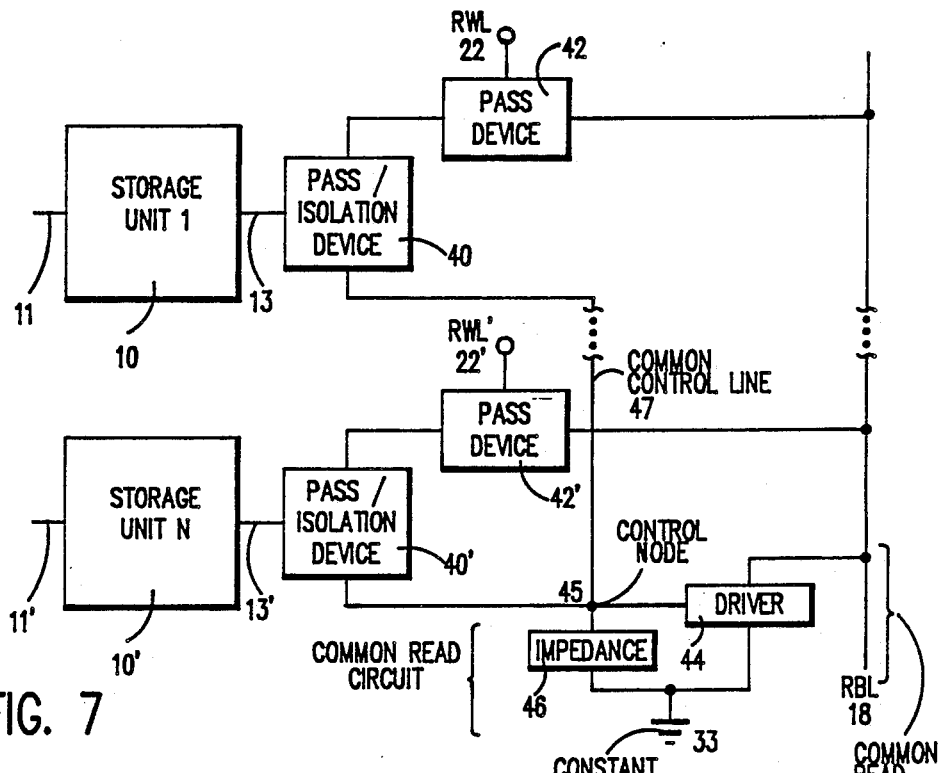
FIG. 7 is a block diagram of an embodiment of the present invention in which the read circuit is used with more than one memory cell.
Figure 8:
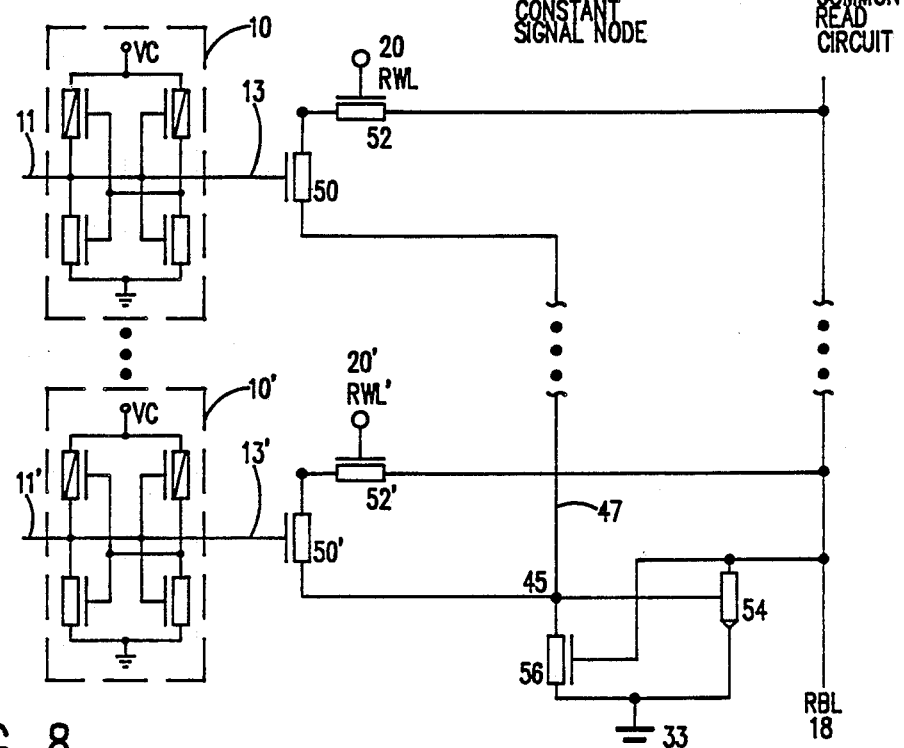
FIG. 8 is schematic circuit diagram of one embodiment of FIG. 7.

A specific circuit embodiment of FIG. 7 is shown in FIG. 8. It is instructive to compare FIG. 8 with FIGS. 4 and 5. With the circuit configuration of FIGS. 7 and 8, it is not necessary to include a read line driver 44 and an impedance 46 with every cell, as is done in the circuits of FIGS. 3–5. Instead, a single driver and a single impedance may be used to read an entire column of cells. As shown in FIG. 7, all of the pass/isolation gates 40, 40', etc. associated with their respective storage units 10, 10', etc. are coupled via a common control line 47 to a single control node 45. Similarly, all of the pass gates 42, 42', etc. are coupled to a single, common read bit line 18.

In this way, read line driver 44 may drive read bit line 18 if any one of the storage units transmits a data signal to control node 45 over line 47 from its associated pass/isolation device. Only one impedance 46 is needed to keep the control terminal of driver 44 from floating. Driver 44 and impedance 46, which form a common read circuit, are coupled to read bit line 18 and common constant signal node 33 in the same manner as that shown in FIG. 3, the only difference being the plurality of lines feeding into node 45 and into bit line 18.

The operation of the circuit of FIG. 7 is similar to the operation of the circuit of FIG. 3, except that since several memory cells are provided per read line, each memory cell preferably has its own separate read word line 22, 22', etc. to permit the individual addressing of cells.

An advantage provided by the circuit of FIGS. 7 and 8 is that fewer devices per memory cell are required. In particular, as shown in FIG. 8, a separate bipolar transistor 54 is not required for each cell. This not only permits a smaller size cell to be fabricated on an integrated circuit chip, but also reduces the capacitance on read bit line 18. Since the capacitance of the collector of a bipolar transistor is relatively high, the fewer collectors coupled to read bit line 18, the lower the total line capacitance will be, and the faster the line switching speed, and hence the read operation, can be.

The read circuit arrangement of FIGS. 7 and 8 is preferred when only a few memory cells are coupled to the same read bit line 18, and the circuit arrangement of FIGS. 3 and 4 is preferred when numerous cells are coupled to read bit line 18. The exact point at which the design of FIGS. 7 and 8 is chosen over the design of FIGS. 3 and 4 depends upon several factors, including the type of fabrication process used for the memory cell transistors, the capacitances of the cell connections and lines, the collector and base capacitances of bipolar transistor 54, the source capacitances of transistors 50 and 50', the size of the individual memory cell transistors and others.

Figure 9:
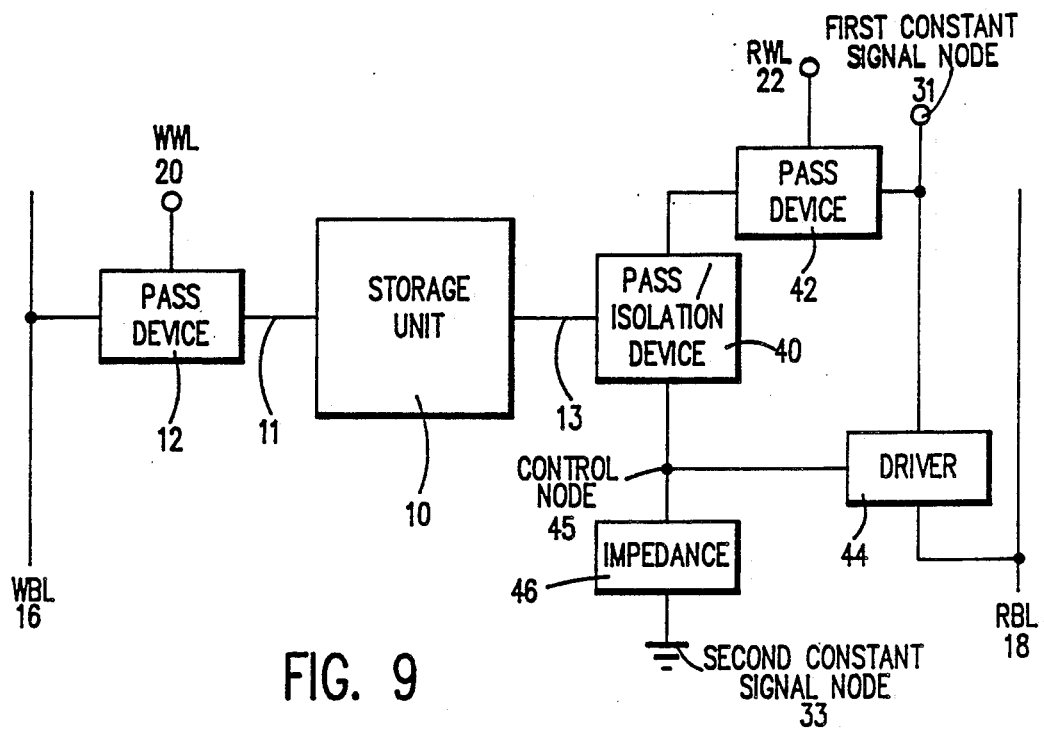
FIG. 9 is a block diagram of an alternative embodiment of the cell of the present invention.
Figure 10:
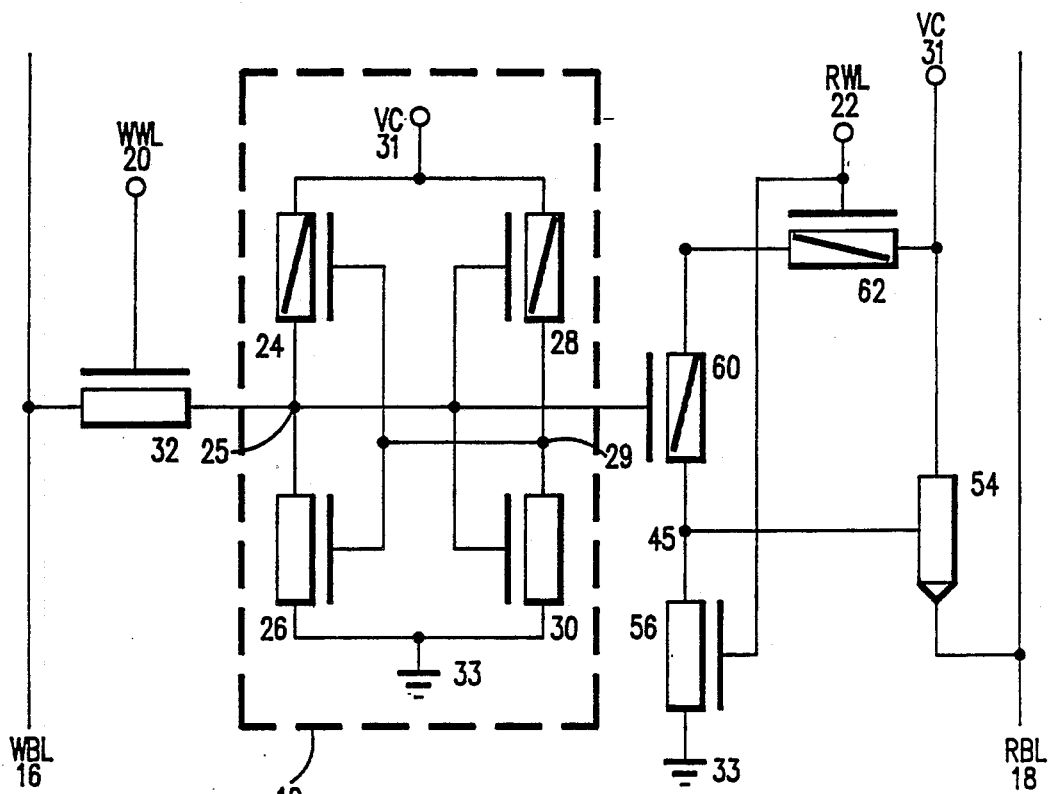
FIG. 10 is a schematic circuit diagram of one embodiment of FIG. 9.

Yet another embodiment of the present invention is the cell shown in FIGS. 9 and 10. In comparing FIG. 9 with FIG. 3, it can be seen that the same elements are used for both cells, but in a slightly different arrangement. In FIG. 9, pass device 42 and read line driver 44 are each coupled to a constant signal terminal $V_c$ 31, instead of to read bit line 18 as in FIG. 3. The other signal terminal of read line driver 44 is, however, coupled to read bit line 18, as before, and pass/isolation device 40 and impedance 46 are also coupled in the same way.

In FIG. 10, it can be seen that the primary difference between this embodiment and the specific embodiment of FIG. 4 is that the bipolar transistor 54 is emitter coupled to read bit line 18 in FIG. 10 instead of being collector coupled to this line, as in FIGS. 4 and 5. This permits bipolar transistor 54 to operate as a pull-up driver for read bit line 18 instead of a pull-down driver as in FIG. 4 and 5. In other words, in operation, bipolar transistor 54 will cause the signal level on read bit line 18 to move from low to high (high being equal to $V_c$) when transistor 54 turns on. Thus, precharging of the read bit line to a high level is not necessary.

Another difference between FIG. 10 and FIGS. 4 and 5 is that the gate of transistor 56 in FIG. 10 is coupled to the read word line 22, instead of to the read bit line 18 in FIGS. 4 and 5. In addition, transistors 60 and 62 of FIG. 10, which correspond to the pass/isolation device 40 and the pass device 42 of FIG. 9, are of a type different from the analogous transistors 50 and 52 of FIGS. 4 and 5. In particular, transistors 60 and 62 comprise PFETs in the preferred embodiment of FIG. 10 instead of NFETs in the preferred embodiments of FIGS. 4 and 5. Thus, the cell could read when the read word line 22 is low.

Aside from the above differences, however, many similarities remain. For example, transistor 62 could be removed (shorted out across its source-drain current path) if a continuous read or latch function is desired, in a manner analogous to the removal of transistor 52 in FIG. 4, as described previously. In addition, a second read circuit could be attached to node 25 to form a dual read port cell, or to node 29 to form a differential read cell, in a manner analogous to that shown in FIG. 6.

The operation of the circuit of FIG. 10 is similar to the operation of the circuits of FIGS. 4 and 5, except that a read operation is initiated by a low level signal on read word line 22 instead of a high level signal as in FIGS. 4 and 5, and read bit line 18 need not be precharged to a high level prior to reading.

An advantage of FIG. 10 is that the bipolar transistor 54 is emitter coupled to read bit line 18. Since the emitter of a typical bipolar transistor generally has less capacitance than the collector of the bipolar transistor, emitter coupling produces a smaller capacitance loading on the read bit line. This permits the read bit line to be switched from low to high or vice versa faster than if the bipolar transistor were collector coupled. The total switching speed of the cell will, however, also depend upon the characteristics of transistors 60 and 62.

Figure 11:
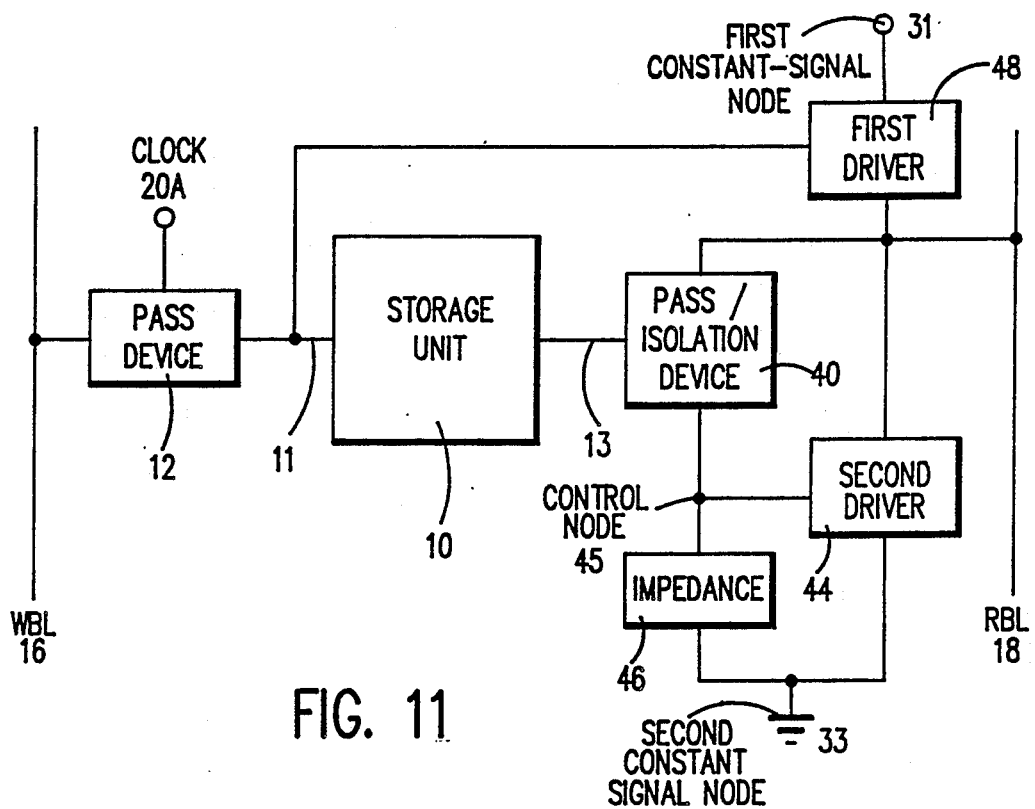
FIG. 11 is a block diagram of another alternative embodiment of the invention in which the cell is capable of a continuous read, or latch, operation.
Figure 12:
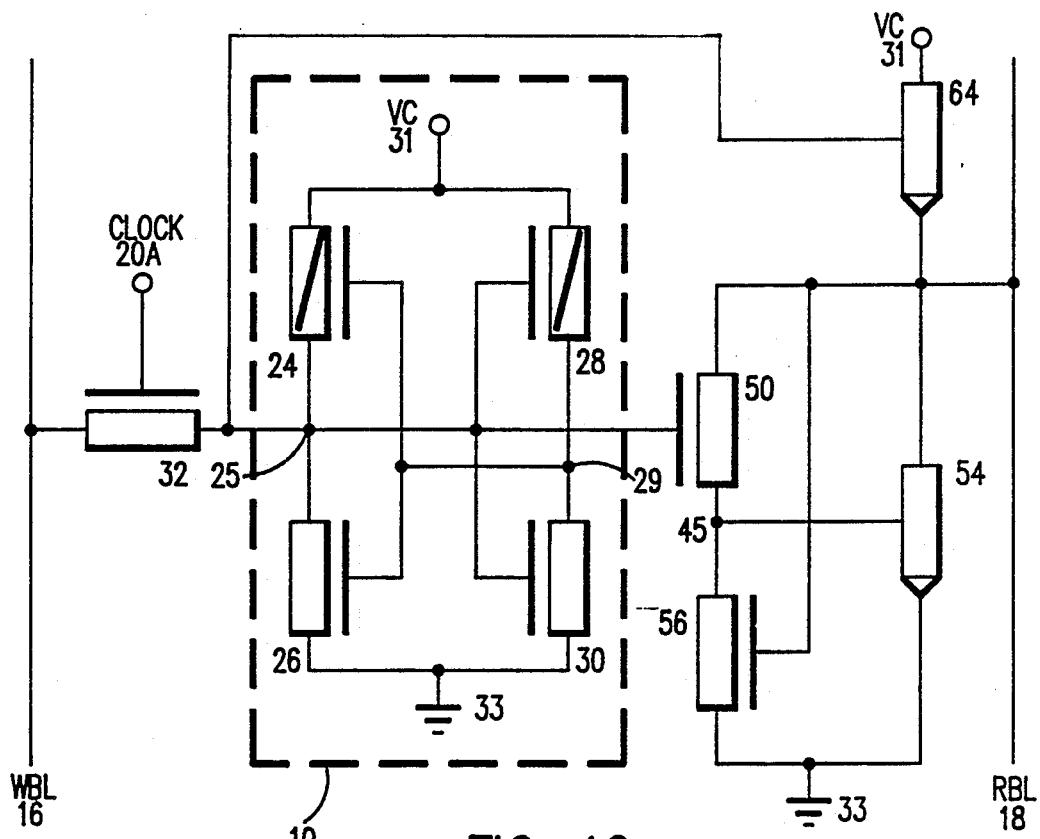
FIG. 12 is a schematic circuit diagram of one embodiment of FIG. 11.

Still another alternative embodiment of the invention is shown in FIG. 11. This circuit is similar in some ways to the circuit of FIG. 3, except that pass device 42 has been removed (replaced with a line), and a second driver 48 has been added. Removal of pass device 42 permits a continuous read operation to take place, thus causing the cell to function as a latch. Terminal 20A could receive a clock signal to write. Adding the second driver 48 permits a rapid push-pull operation to be used for driving the read bit line 18. A specific circuit implementation of the cell of FIG. 11 is shown in FIG. 12, where a second bipolar transistor 64 comprises the second driver 48 of FIG. 11. In this circuit, transistor 50 functions both as a pass/isolation device and as a device to prevent transistor 54 from saturating.

Figure 13:
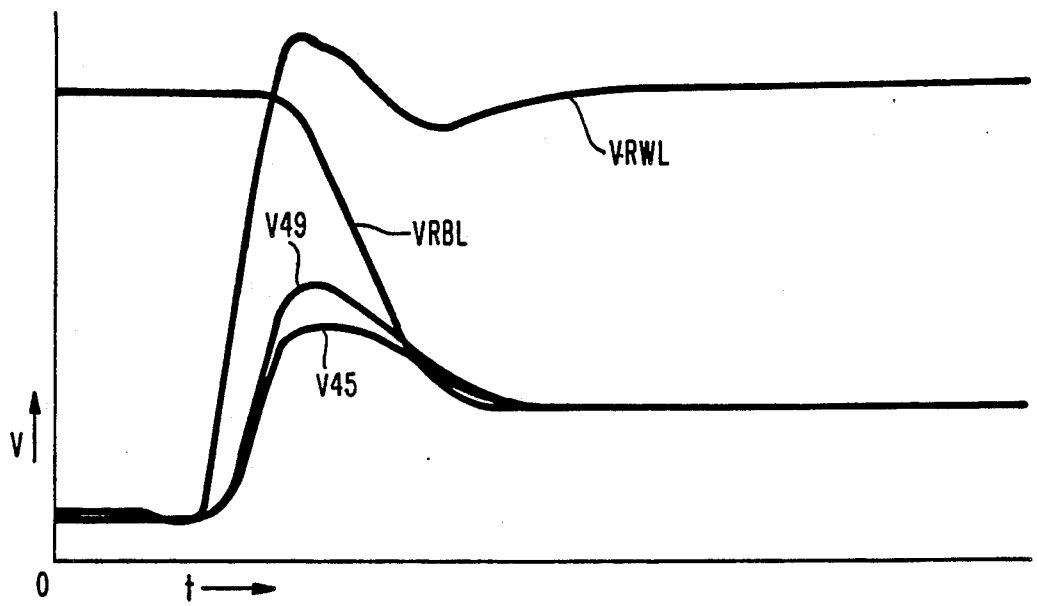
FIG. 13 is a timing diagram of a read operation of the embodiment of FIG. 4.

To aid in the understanding of the operation of some of the various embodiments, time-response diagrams are shown in FIGS. 13–16. FIG. 13 shows the voltages over time of various points of the circuit of FIG. 4 during a "read 0" operation. $V_{RWL}$ is the "read enable" voltage signal sent over read word line 22 to the gate of transistor 52; $V_{49}$ is the voltage at node 49 of the circuit; $V_{45}$ is the voltage at control node 45; and $V_{RBL}$ is the voltage on the write bit line 18. At time t=0, it is assumed that a "0" is stored in storage unit 10, meaning that internal node 25 is "high" and $V_{RBL}$ is also "high" (having been precharged). As $V_{RWL}$ goes "high", $V_{49}$ and $V_{45}$ will also rapidly go "high," indicating that transistors 52 and 50 are rapidly turning on. $V_{RBL}$ will then be rapidly pulled "low" by transistor 54, as shown, indicating that a "0" has been sensed. It can be seen that the read operation has been accomplished very quickly, even before $V_{RWL}$ has stabilized.

Figure 14:
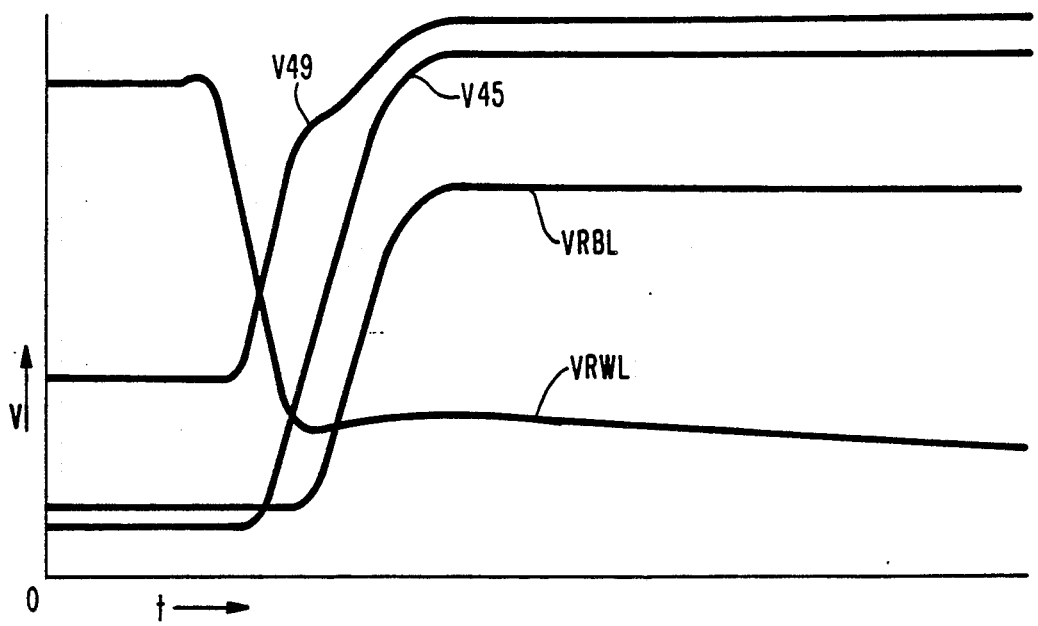
FIG. 14 is a timing diagram of a read operation of the embodiment of FIG. 10.

FIG. 14 shows voltages over time of the circuit of FIG. 10 during a "read 1" operation. Here, $V_{RBL}$ is initially "low" (read bit line 18 not having been precharged), and $V_{RWL}$ is sent from "high" to "low" to initiate a read. It can be seen that $V_{RBL}$ rapidly goes "high" to accomplish the read.

Figure 15:
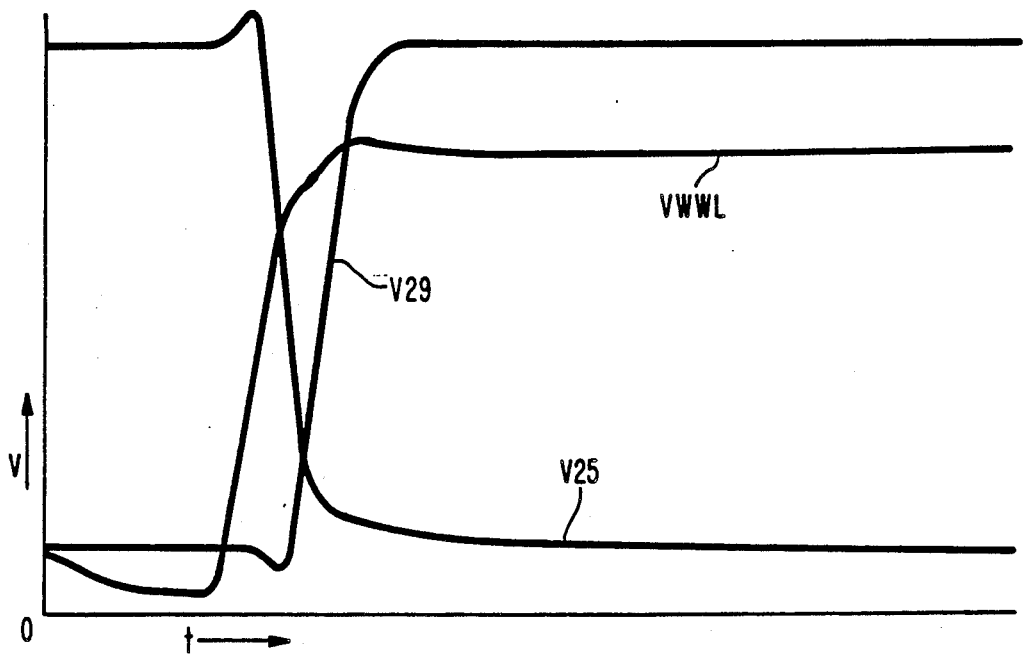
FIG. 15 is a timing diagram of a write operation from "high" to "low" of the embodiment of FIG. 4.

FIG. 15 shows voltages over time of the circuit of FIG. 4 during a "write 0" operation. It is assumed that the cell is initially storing a "1," meaning that the voltage at internal node 25 ($V_{25}$) is "high," and the voltage at internal node 29 ($V_{29}$) is "low." It can be seen that both $V_{25}$ and $V_{29}$ undergo a very rapid transition in opposite directions, meaning that the storage unit 10 had changed state, in response to a "write enable" signal ($V_{WWL}$) sent over write word line 20 to the gate of transistor 32. (Write bit line 16 was initially precharged "high" in this case.)

Figure 16:
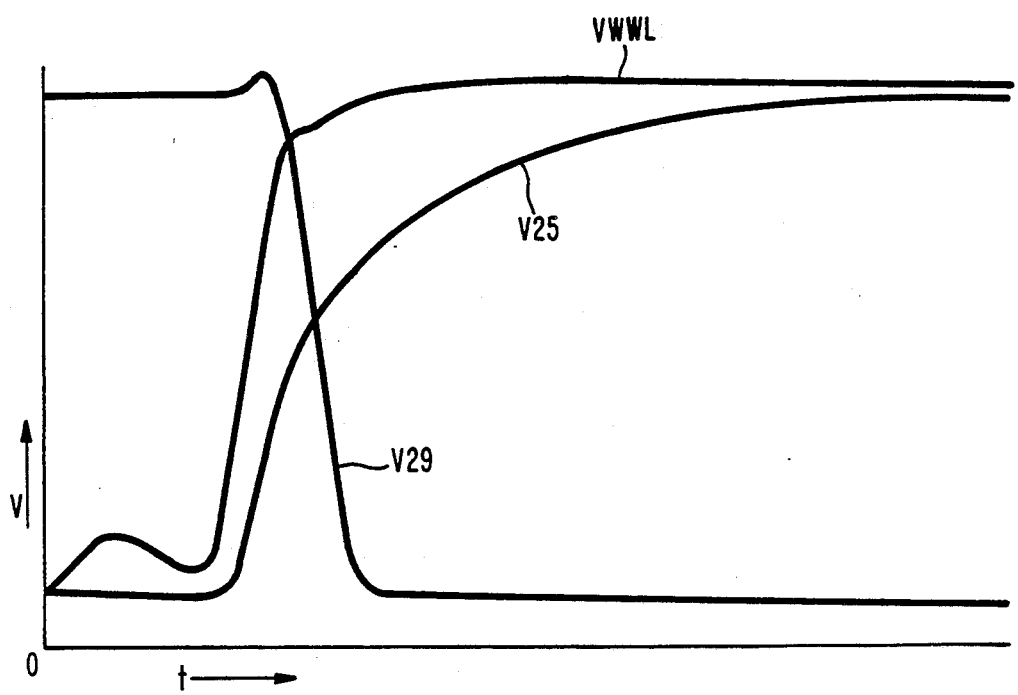
FIG. 16 is a timing diagram of a write operation from "low" to "high" of the embodiment of FIG. 4.
Figure 18:
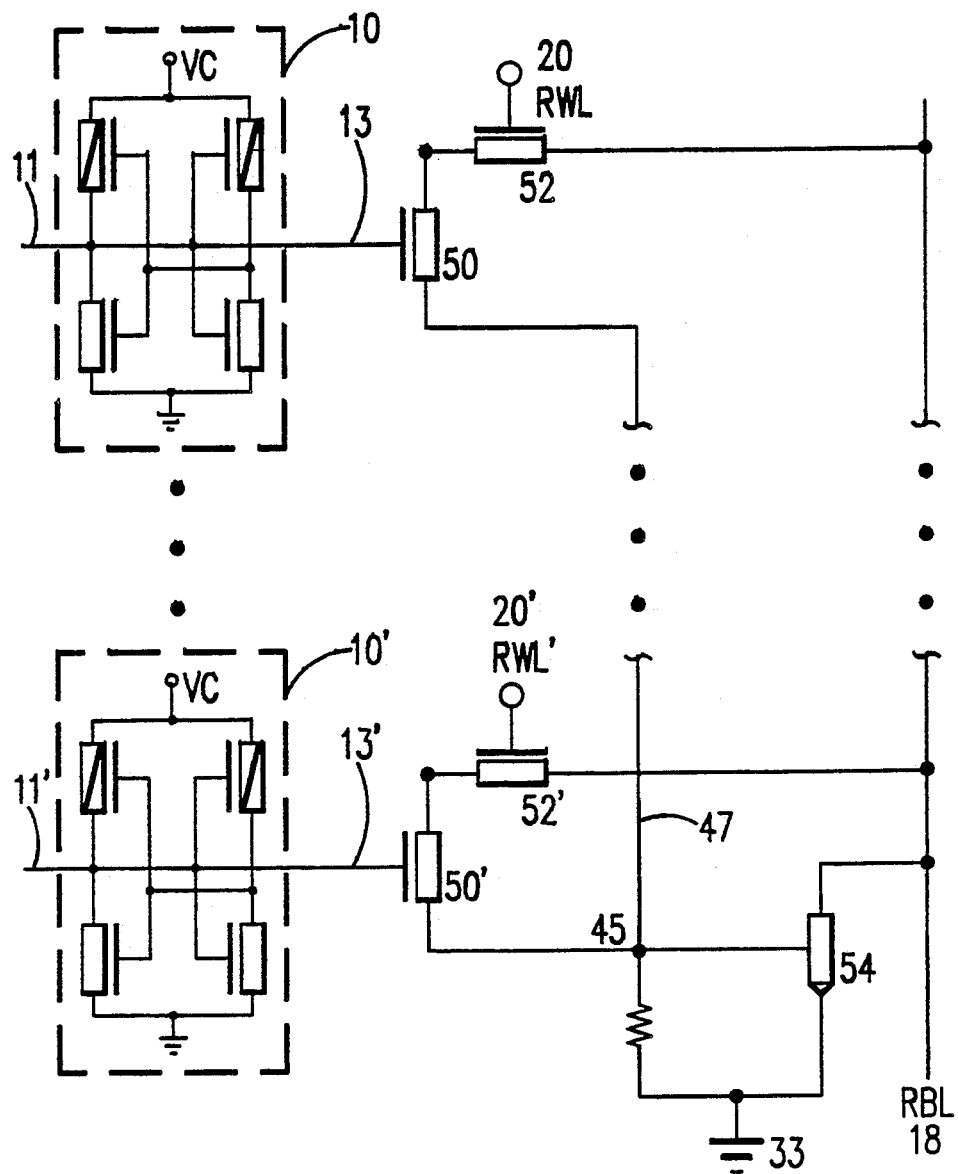
FIG. 18 is an alternative embodiment of FIG. 18.
Figure 17:
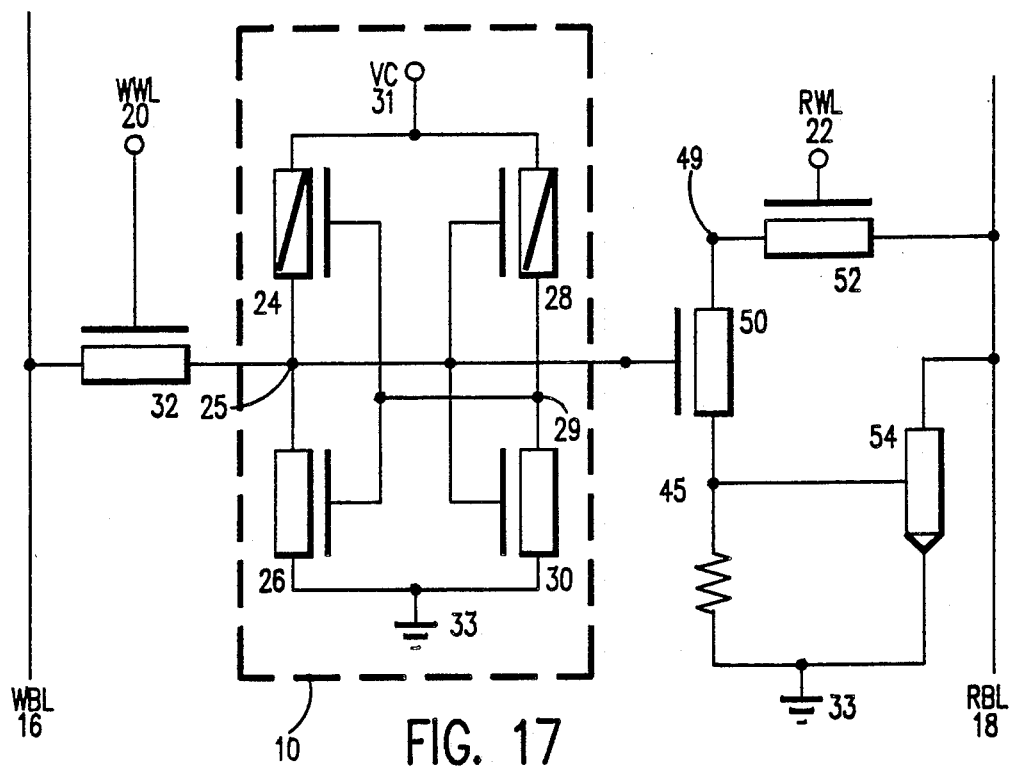
FIG. 17 is an alternative embodiment of FIG. 4.
Figure 19:
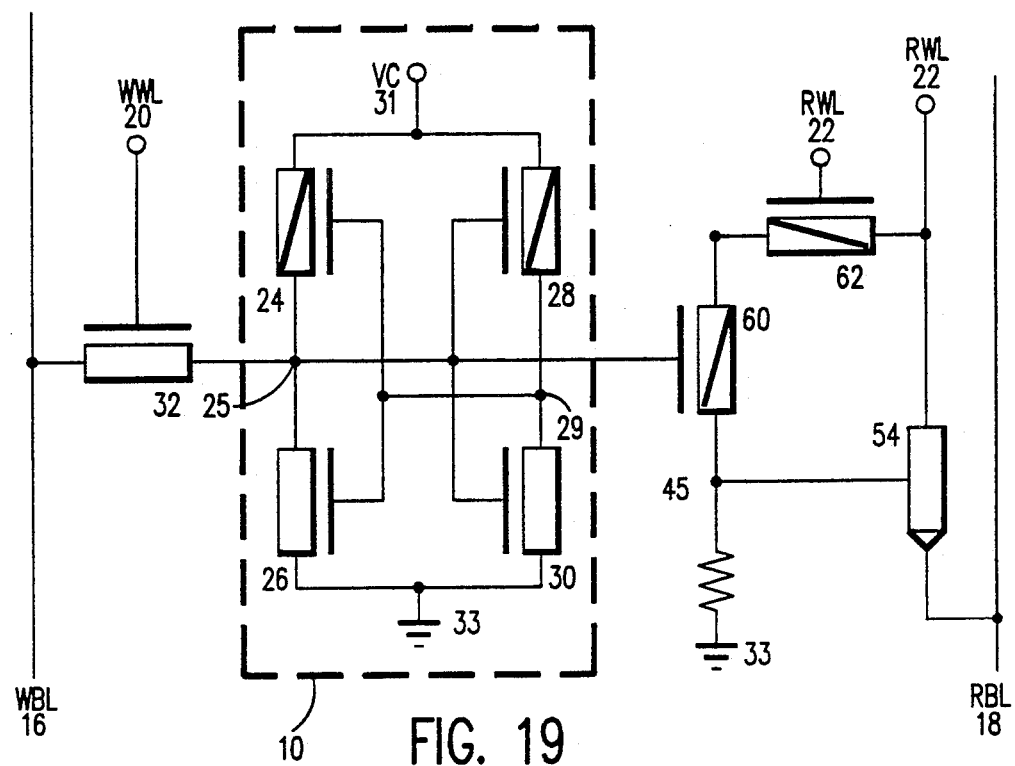
FIG. 19 is an alternative embodiment of FIG. 10.
Figure 20:
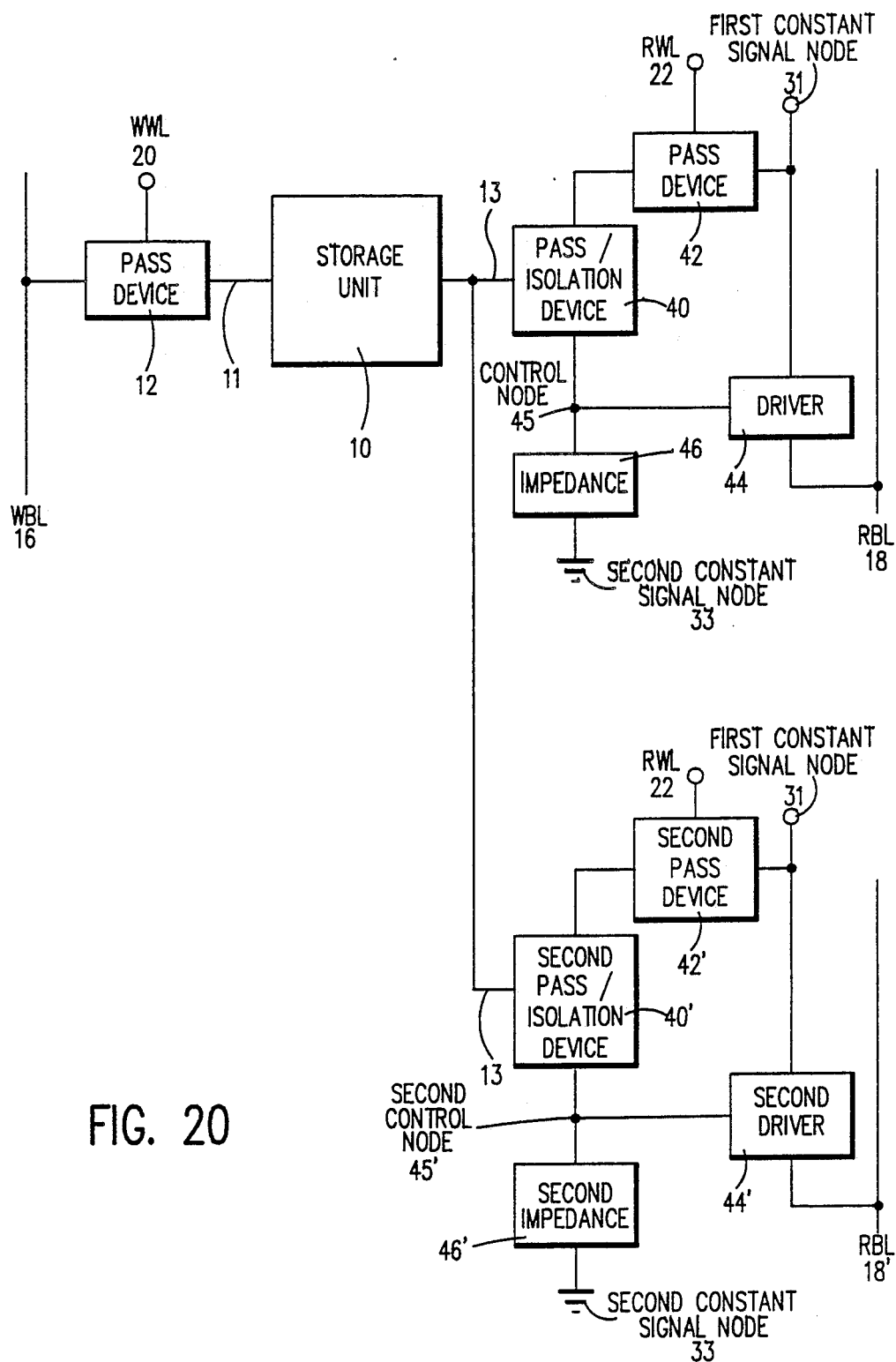
FIG. 20 is an alternative embodiment of FIG. 9.

FIG. 16 shows voltages over time of the circuit of FIG. 4 during a "write 1" operation, the cell having initially stored a "0." Again, it can be seen that a very rapid switching (and hence writing) time is accomplished for this cell.

While the invention has been particularly shown and described with reference to the preferred embodiments thereof, it will be understood by those skilled in the art that various changes in form and detail may be made therein without departing from the spirit and scope of the invention. For example, the NFET transistors in the embodiments could be replaced by PFET transistors, and vice versa, with little or no modification, and the bipolar transistor 54 could be a PNP type instead of an NPN type if transistors 50, 52 and 56 are changed to PFETS. The invention may also, for example, find application in other types of memories, such as optical or electro-optical, in which case the "signals" referred to herein could be light pulses instead of voltage levels.

We claim:

1. A memory cell comprising:
   a storage unit for storing a data signal;
   a pass device and a pass/isolation device, each having a signal path and a control terminal, the signal paths therethrough being coupled together in series between a control node and a read line, the control terminal of the pass device being coupled to an enable line and the control terminal of the pass/isolation device being coupled to the storage unit; and
   a driver having a signal path coupled between the read line and a constant-signal node, and having a control terminal coupled to the control node, and arranged to cause a read signal proportional to the data signal to appear on the read line in response to an enable signal on the enable line.

2. The cell of claim 1 in which the storage unit comprises a flip-flop formed from two cross-coupled inverters, each inverter comprising, two field-effect transistors (FETs).

3. The cell of claim 1 in which the pass device and the pass/isolation device each comprise an FET.

4. The cell of claim 1 in which the driver comprises a bipolar transistor.

5. The cell of claim 4 in which the bipolar transistor is of the NPN type.

6. The cell of claim 4 in which the control terminal of the driver comprises the base of the bipolar transistor and the signal path of the driver comprises a current path between the collector and the emitter of the bipolar transistor, the collector being coupled to the read line and the emitter being coupled to the constant-signal node.

7. The cell of claim 1 in which an impedance is coupled between the control node and the constant-signal node.

8. The cell of claim 7 in which the impedance comprises a resistor.

9. The cell of claim 7 in which the impedance comprises an FET, the source-drain current path of which is coupled between the control node and the constant-signal node, and the gate of which is coupled to the read line.

10. The cell of claim 1 in which the storage impedance are all contained on a single integrated circuit chip.

11. The cell of claim 1 in which the read line is precharged, prior to the application of the enable signal on the enable line, to a signal level different from a signal level maintained at the constant-signal node.

12. The cell of claim 11 in which the precharge level is a relatively high voltage level and the constant-signal node level is a relatively low voltage level.

13. The cell of claim 1 in which the data signal comprises a variable voltage level representing either a logical "1" or a logical "0", and the constant-signal node is maintained at a different constant voltage level representing either a logical "1" or a logical "0".

14. The cell of claim 1 further including:
    a second pass device and a second pass/isolation device, each having a signal path and a control terminal, the signal paths therethrough being coupled together in series between a second control node and a second read line, the control terminal of the second pass device being coupled to a second enable line and the control terminal of the second pass/isolation device being coupled to the storage unit; and
    a second driver having a signal path coupled between the second read line and the constant-signal node, and having a control terminal coupled to the second control node, and arranged to cause a read signal proportional to the data signal to appear on the second read line in response to a second enable signal on the second enable line;
    to form a second, independent read circuit and port for the storage unit.

15. A read circuit for a memory array, comprising:
    at least one storage unit for storing at least one data signal;
    at lease one pass device and at least one pass/isolation device associated with each storage unit, the pass device and the pass/isolation device each having a signal path and a control terminal;
    each storage unit being coupled to the control terminal of its associated pass/isolation device, the signal path of the pass/isolation device being coupled at one end to a common control line and coupled at the other end to one end of the signal path of the pass device, the other end of the pass device signal path being coupled to a common read line, the control terminal of the pass device being coupled to an enable line; and
    a common driver having a signal path coupled between the common read line and a common constant-signal node, and having a control terminal coupled to the common control line, and arranged to cause a read signal proportional to the data signal stored in any one storage unit to appear on the common read line in response to an enable signal on the enable line associated with that storage unit.

16. The circuit of claim 15 in which each pass device and each pass/isolation device comprises an FET.

17. The circuit of claim 15 in which the common driver comprises a bipolar transistor.

18. The circuit of claim 17 in which the bipolar transistor is of the NPN type.

19. The circuit of claim 17 in which the control terminal of the common driver comprises the base of the bipolar transistor and the signal path of the common driver comprises a current path between the collector and the emitter of the bipolar transistor, the collector being coupled to the common read line and the emitter being coupled to the common constant-signal node.

20. The circuit of claim 15 in which a common impedance is coupled between the common control node and the common constant-signal node.

21. The circuit of claim 20 in which the common impedance comprises a resistor.

22. The circuit of claim 20 in which the common impedance comprises a field-effect transistor, the source-drain current path of which is coupled between the common control node and the common constant-signal node, and the gate of which is coupled to the common read line.

23. The circuit of claim 15 in which the storage unit, pass device, pass/isolation device, driver and impedance are all contained on a single integrated circuit chip.

24. The circuit of claim 15 in which the common read line is precharged, prior to the application of any enable signal on any enable line, to a signal level different from a signal level maintained at the common constant-signal node.

25. The circuit of claim 24 in which the precharge level is a relatively high voltage level and the common constant-signal node level is a relatively low voltage level.

26. The circuit of claim 15 in which the data signal comprises a variable voltage level representing either a logical "1" or a logical "0", and the common constant-signal node is maintained at a different constant voltage level representing either a logical "1" or a logical "0".

27. A memory cell comprising:
a storage unit for storing a data signal;
a pass device and a pass/isolation device, each having a signal path and a control terminal, the signal paths therethrough being coupled together in series between a control node and a first constant-signal node, the control terminal of the pass device being coupled to an enable line and the control terminal of the pass/isolation device being coupled to the storage unit; and
a driver having a signal path coupled between the read line and the first constant-signal node, and having a control terminal coupled to the control node, and arranged to cause a read signal proportional to the data signal to appear on the read in response to an enable signal on the enable line.

28. The cell of claim 27 in the storage unit comprises a flip-flop formed two cross-coupled inverters, each inverter comprising two FETs.

29. The cell of claim 27 in which pass device and the pass/isolation device each comprise an FET.

30. The cell of claim 27 in which the driver comprises a bipolar transistor.

31. The cell of claim 30 in the bipolar transistor is of the NPN type.

32. The cell of claim 30 in which the control terminal of the driver comprises the base of the bipolar transistor and the signal path of the driver comprises a current path between the collector and the emitter of the bipolar transistor, the emitter being coupled to the read line and the collector being coupled to the first constant-signal node.

33. The cell of claim 27 in which an impedance is coupled between the control node and a second constant-signal node.

34. The cell of claim 33 in which the impedance comprises a resistor.

35. The cell of claim 33 in which the impedance comprises an FET, the source-drain current path of which is coupled between the control node and the second constant-signal node, and the gate of which is coupled to the enable line.

36. The cell of claim 27 in which the storage unit, pass device, pass/isolation device, driver and impedance are all contained on a single integrated circuit chip.

37. The cell of claim 27 in which the read line is precharged, prior to the application of the enable signal on the enable line, to a signal level different from a signal level maintained at the first constant-signal node.

38. The cell of claim 37 in which the precharge level is a relatively low voltage level and the first constant-signal node level is a relatively high voltage level.

39. The cell of claim 37 in which the data signal comprises a variable voltage level representing either a logical "1" or a logical "0", first constant-signal node is maintained at a constant voltage level representing either a logical "0" or a logical "1", and the second constant-signal node is maintained at a different constant voltage level representing either a logical "1" or a logical "0".

40. A cell of claim 27 further comprising:
a second pass device second pass/isolation device, each having a si path and a control terminal, the signal paths being coupled together in series between second control node and the first constant-signal the control terminal of the second pass device coupled to a second enable line and the control terminal of the second pass/isolation device being coupled to the storage unit; and
a second driver having a signal path coupled between the second read and the first constant-signal node, and having a terminal coupled to the second control node, and arranged to cause a read signal proportional to the data signal to appear on the second read line in response to a second enable signal on the second enable line;
to form a second, independent in read circuit and port for the storage unit.

41. A single-bit dual-port BICMOS static RAM memory cell comprising:
write word line and read word line;
a write bit line and read bit line;
a single-bit flip- storage unit comprising two cross-coupled inverters, the first inverter comprising first and field-effect transistors of opposite types, the source-drain current path of the first FET being coupled between a voltage source and a first internal node the source-drain current path of the second FET b coupled between the first internal node and ground the gate terminals of the first and second FET coupled together and to a second internal node;
the second inverter comprising third and fourth FETs of opposite types, the source-drain current path of the third. FET being coupled between the voltage source and the second internal node, the source-drain current path of the fourth FET being coupled between the second internal node and ground, and the gate terminals of the third and fourth FETs being coupled together and to the first internal node;
a write pass device comprising a fifth FET, the source-drain current path of which is coupled between the write bit line and the first internal node, and the gate of terminal which is coupled to the write word line;

a read pass device and a read pass/isolation device comprising, respectively, sixth and seventh FETs, having their source-drain current paths coupled in series and between the read bit line and a control node, the gate of the sixth FET being coupled to the read word line and the gate terminal of the seventh FET being to the first internal node;

an impedance comprising an eighth FET, the source-drain current path of which is coupled between the control node and ground, and the gate terminal of which is coupled to the read bit line; and a read bit line driver comprising a bipolar transistor, the collector of which is coupled to the read bit line, the emitter of which is coupled to ground and the base of which is coupled to the control node.

42. The memory cell of claim 41 in which the second, fourth, fifth, sixth, seventh and eight FETs are of the N-channel type and the fi st and third FETs are of the P-channel type.

43. The memory cell of claim 41 in which the FETs bipolar transistor is of the NPN type.

44. The memory cell of claim 41 in which the FETs and the bipolar transistor are all contained on a single integrated circuit chip.

45. The memory cell of claim 41 further including:
a second read bit line;
a second read pass device and second read pass/isolation device comprising, respectively, ninth and tenth FETs, having their source-drain current paths coupled in series and between the second read bit line and a second control node, the gate terminal of the ninth FET being coupled to read word line and the gate terminal of the tenth being coupled to the second internal node;
a second impedance comprising an eleventh FET, the source-drain current path of which is coupled between the second control node and ground, and the gate terminal of which is coupled to the second read bit line; and
a second read bit line driver comprising a second bipolar transistor, the collector of which is coupled to the second read bit line, the emitter of which is coupled to ground and the base of which is coupled to the second control node;
to form a memory cell having a differential read capability.

46. A data read circuit for column of memory cells, comprising:
a common read bit line;
a common control line;
a plurality of read word lines;
a plurality of single-bit st units each storage unit having an output coupled to the gate terminal of a first yield-effect transistor (FET) associated with such storage unit, such FET comprising a pass/isolation device, the source-drain path of such FET being coupled at one end to the common control line and coupled at the other end to one end of the source-drain current path of a second FET associated with such storage unit, such FET comprising a pass device, the other end of such current path being coupled to the common read bit line, the gate of the second FET being coupled to a particular read word line;
a bipolar transistor comprising a common bit line driver device, the collector of which is coupled to the common read bit line, the emitter of which is coupled to ground and the base of which is coupled to the common control line; and
an FET comprising an impedance device, the source-drain current path of which is coupled between the common control line and ground, and the gate of which is coupled to the common read bit line.

47. The data read circuit of claim 46 in which each FET is of the N-channel type.

48. The data read circuit of claim 46 in which the bipolar transistor is of the NPN type.

49. A single-bit, dual-port, BICMOS static RAM memory cell, comprising:
a write word line and a read word line;
a write bit line and a read bit line;
a single-bit flip-flop storage unit comprising two cross-coupled inverters, the first inverter comprising first and second field-effect transistors (FETs) of opposite types, the source-drain current path of the first FET being coupled between a voltage source and a first internal node, the source-drain current path of the second FET being between the first internal node and ground, the gate terminals of the first and second FETs being coupled together and to a second internal node;
the second inverter comprising third and fourth FETs of opposite types, the source-drain current path of the third FET being coupled between the voltage source and the second internal node, the source-drain current path of the fourth FET being coupled between the second internal node and ground, and the gate terminals of the third and fourth FETs being coupled together and to the first internal node;
a write pass device comprising a fifth FET, the source-drain current path of which is coupled between the write bit line and the first internal node, and the gate terminal of which is coupled to the write word line;
a read pass device and a read pass/isolation device comprising, respectively, sixth and seventh FETs, having their source-drain current paths coupled in series and between the voltage and a control node, the gate terminal of the gate being coupled to the read word line and the gate terminal of the seventh FET being coupled to the second internal node;
an impedance comprising an eighth FET, the source-drain current path of which is coupled between the control node and ground, and the gate terminal of which is coupled to the read word line; and
a read bit line driver comprising a bipolar transistor, the collector of which is coupled to the voltage source, the emitter of which is coupled to the read bit line and the base of which is coupled to the control node.

50. The memory cell of claim 49 in which the second, fourth, fifth and eighth FETs are of the N-channel type and the first, third sixth and seventh FETs are of the P-channel type.

51. The memory cell of claim 49 in which the bipolar transistor is of the NPN type.

52. The memory cell of claim 49 in which the FETs and the bipolar transistor are all contained on a single integrated circuit chip.

53. A continuous-read memory cell comprising:
a storage unit for storing a data signal;
a pass/isolation device having a signal path and a control terminal, the control terminal being coupled to the storage unit and the signal path being coupled between a read line and a control node; and a driver having a signal path coupled between the read line and a constant-signal node, and having a control terminal coupled to the control node, and arranged to cause a read signal proportional to the data signal to appear continuously on the read line.

54. The memory cell of claim 53 in which an impedance is coupled between the control node and the constant-signal node.

55. The memory cell of claim 53 in which the pass/isolation device comprises a field-effect transistor and the driver comprises a bipolar transistor.

56. The memory cell of claim 53 in which the storage unit, pass/isolation device and driver are all contained on the same integrated circuit chip.

57. A continuous-read, dual-driver memory cell comprising:
 a storage unit for storing a data signal;
 a pass/isolation device having a signal path and a control terminal, the control terminal being coupled to the storage unit and the signal path being coupled between a read line and a control node;
 a first driver having a signal path coupled between the read line and a first constant-signal node, and having a control terminal coupled to the storage unit; and
 a second driver having a signal path coupled between the read line and a second constant-signal node, and having a control terminal coupled to the control node;
 the pass/isolation device and the drivers being arranged to cause a read signal proportional to the data signal to appear continuously on the read line.

58. The memory cell of claim 57 in which an impedance is coupled between the control node and the first constant-signal node.

59. The memory cell of claim 57 in which the pass/isolation device comprises a field-effect transistor and each driver comprises a bipolar transistor.

60. The memory cell of claim 57 in which the storage unit, pass/isolation device and both drivers are contained on the same integrated circuit chip.

* * * * *

UNITED STATES PATENT AND TRADEMARK OFFICE
CERTIFICATE OF CORRECTION

PATENT NO. : 4,995,001
DATED : February 19, 1991
INVENTOR(S) : J. W. Dawson and P. A. Phillips It is certified that error appears in the above-identified patent and that said Letters Patent is hereby corrected as shown below:

Claim 10, line 66-67 delete "impedance" and insert --unit, pass device, pass/isolation device, drive and impedance--.

Claim 39, line 14, delete "37" and insert --27--.

Claim 40, line 24, delete "si" and insert --signal--.

Claim 40, line 27, after "signal" insert --node--.

Claim 40, line 28, after "device" insert --being--.

Claim 40, line 32, after "read" insert --line--.

Claim 40, line 34, after "a" insert --control--.

Claim 40, line 38, after "independent" delete "in".

Claim 41, line 46, after "and" insert --second--.

Claim 41, line 53, after "FET" insert --being--.

Claim 43, line 20, delete "FETs".

Claim 46, line 57, after "drain" insert --current--.

Claim 49, line 21, after "being" insert --coupled--.

Signed and Sealed this

Sixteenth Day of March, 1993

Attest:

STEPHEN G. KUNIN

Attesting Officer

Acting Commissioner of Patents and Trademarks